United States Patent [19]

Dorsman

[11] 4,099,876
[45] Jul. 11, 1978

[54] PHASE-CODED CONTROL FOR RING LASER GYRO

[75] Inventor: Adrian K. Dorsman, Bellflower, Calif.

[73] Assignee: Rockwell International Corporation, El Segundo, Calif.

[21] Appl. No.: 777,369

[22] Filed: Mar. 14, 1977

[51] Int. Cl.$^2$ .............................. G01B 9/02; G01P 9/00
[52] U.S. Cl. ............................... 356/106 LR; 310/317; 331/94.5 S
[58] Field of Search ............ 356/106 LR; 331/94.5 S; 310/317

[56] References Cited

U.S. PATENT DOCUMENTS 3,555,453  1/1971  Littauer .................................. 310/317

Primary Examiner—Vincent P. McGraw
Attorney, Agent, or Firm—L. Lee Humphries; H. Frederick Hamann; Rolf M. Pitts

[57] ABSTRACT

In a laser gyro, laser optics adjustment means comprising a mirror within the laser optics of the gyro and mounted upon a three-terminal duo-mode bimorph device for duo-mode modulation of the laser optics. A two-stage differential amplifier is responsively coupled to a source of two mutually phase-coded reference signals for separately dithering each mode of the duo-mode bimorph device, each stage being further responsive to a mutually exclusive one of a first and second synchronously detected photodetector output of the laser gyro whereby closed loop control of the laser optics is effected.

10 Claims, 5 Drawing Figures

PHASE-CODED CONTROL FOR RING LASER GYRO

BACKGROUND OF THE INVENTION

In the practical or successful operation of a ring laser type gyro, it is necessary to adjust the length of the laser optical path to achieve that optimum laser frequency associated with maximum laser gain. Also, adjustment of the alignment of the laser optics is required for stabilizing system losses. In other words, an optimum path length adjustment is sought for maximum laser intensity, while maintenance of an optimum optical path alignment is sought in order to maintain optical cavity losses preferably at a minimum or at least at a constant value. Thus, by means of both adjustments, a peak laser output intensity is obtained and gyro bias stabilization is improved.

As discussed in co-pending application Ser. No. 768,511 for Laser Optics Control for Ring Laser Gyro, filed February 14, 1977 by Sidney G. Shutt, assignor to Rockwell International Corporation, assignee of the subject application, prior methods for effecting such adjustments have relied upon movable mirrors for path length adjustment and stable geometry of mechanically positioned optical elements. However, obvious limits are imposed with regard to the mechanical tolerances and geometric stability achievable for a given design and choice of materials. Also, such limits are approached only at high unit costs and manufacturing expense. Further, the error sources associated with such limits are subject to change due to thermal expansion, material "creep" and the like.

The above-noted co-pending application Ser. No. 768,511 describes a technique for laser gyro path length and alignment control adjustment of a movable mirror interposed in the laser optical path. In such arrangement, two frequency-coded signals are employed to drive a duo-mode bimorph device whereby the path length is modulated to produce a modulated beam intensity which may be photoelectrically sensed and synchronously demodulated to provide an error path signal for closed loop duo-mode control of the movable mirror. However, such duo-mode control mechanization requires a substantial duplication of electronics for such duo-mode control, as to reduce system reliability, increase system initial acquisition and maintenance costs. For example, the use of two frequency-coded reference signals requires two reference signal generators, while the use of separate control amplifiers involves duplication of the control electronics with consequent design problems of gain and phase tracking or calibration.

BRIEF DESCRIPTION OF THE INVENTION

By means of the concept of my invention, the above-noted shortcomings of the prior art are overcome, and there is provided more efficient electronic means for duo-mode control of the length and alignment of the gyro laser optical path.

In a preferred embodiment of the invention, a mirror within the laser optics of a laser gyro is mounted upon a three-terminal duo-mode bimorph device for duo-mode modulation of the laser optics. A two-stage differential amplifier is responsively coupled to a course of two mutually phase-coded reference signals for separately dithering each mode of the duo-mode bimorph device. Each stage of the differential amplifier is responsive to a mutually exclusive one of a first and second synchronously detected photodetector output of the laser gyro, whereby closed loop control of the laser optics is effected.

In normal cooperation of the above-described arrangement, dual modulation or dithering of the laser optics is effected by the separate response of each mode of the bimorph to a mutually exclusive one of the two phase reference signals, while synchronous detection of the separately modulated components of the laser output by a mutually exclusive one of the phase reference signals provides separate control signals for closed-loop control of each of the two modes separately of the other. In this way, both optimum path length and gyro bias stabilization are obtained automatically without unnecessary duplication of the control electronics.

Accordingly, it is an object of the invention to provide improved closed-loop means for regulating the performances of a ring laser type gyro.

Another object of the invention is to provide phase-coded modulation of a bimorph device in dual-mode control of the laser optics of a ring laser gyro.

Still a further object is to provide means for reducing the electronics required to effect closed-loop control of the path length and alignment of the laser optics in a ring laser gyro.

These and other objects of the invention will become apparent from the following description, taken together with the accompanying drawings in which:

BRIEF DESCRIPTION OF THE DRAWINGS

In the figures, like reference characters refer to like parts.

DESCRIPTION OF THE PREFERRED EMBODIMENT

Figure 1:
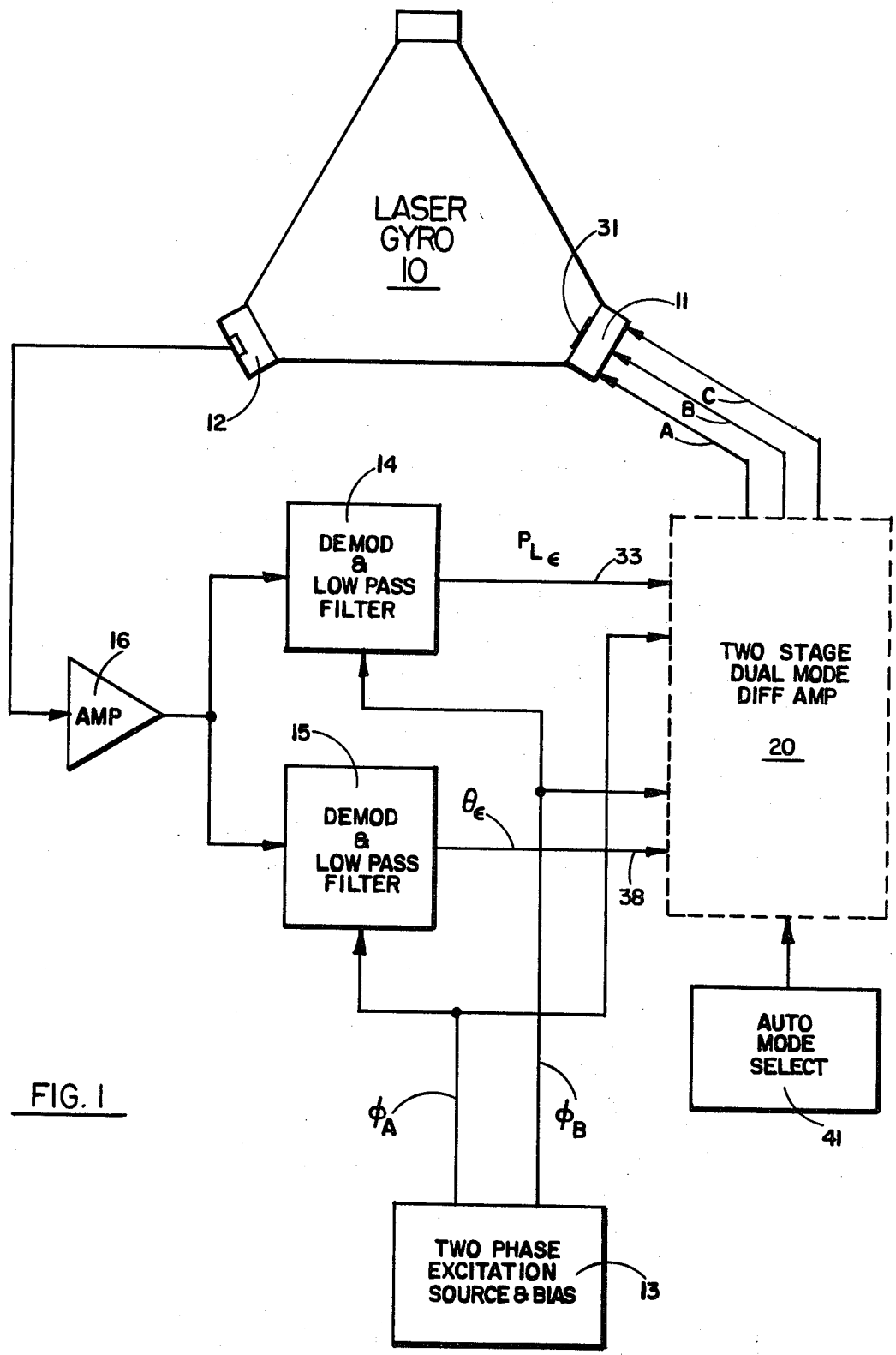
FIG. 1 is a block diagram of a system embodying the concept of the invention.

Referring now to FIG. 1, there is illustrated in block diagram form a system embodying the concept of the invention. There is provided a ring laser gyro 10 having a bimorph element (and mirror) 11 mounted at one corner of the folded optic path of the laser cavity and a photodetector 12 mounted to another corner thereof. Bimorph element 11 is split in the manner described in the above-noted co-pending Application Ser. No. 768,511 as to have dual control modes, but with the difference that each mode is controllable by differential signalling across a mutually exclusive one of first terminal pair A and B, and the set AB and terminal C, represented by control lines A, B and C, in FIG. 1.

Figure 2:
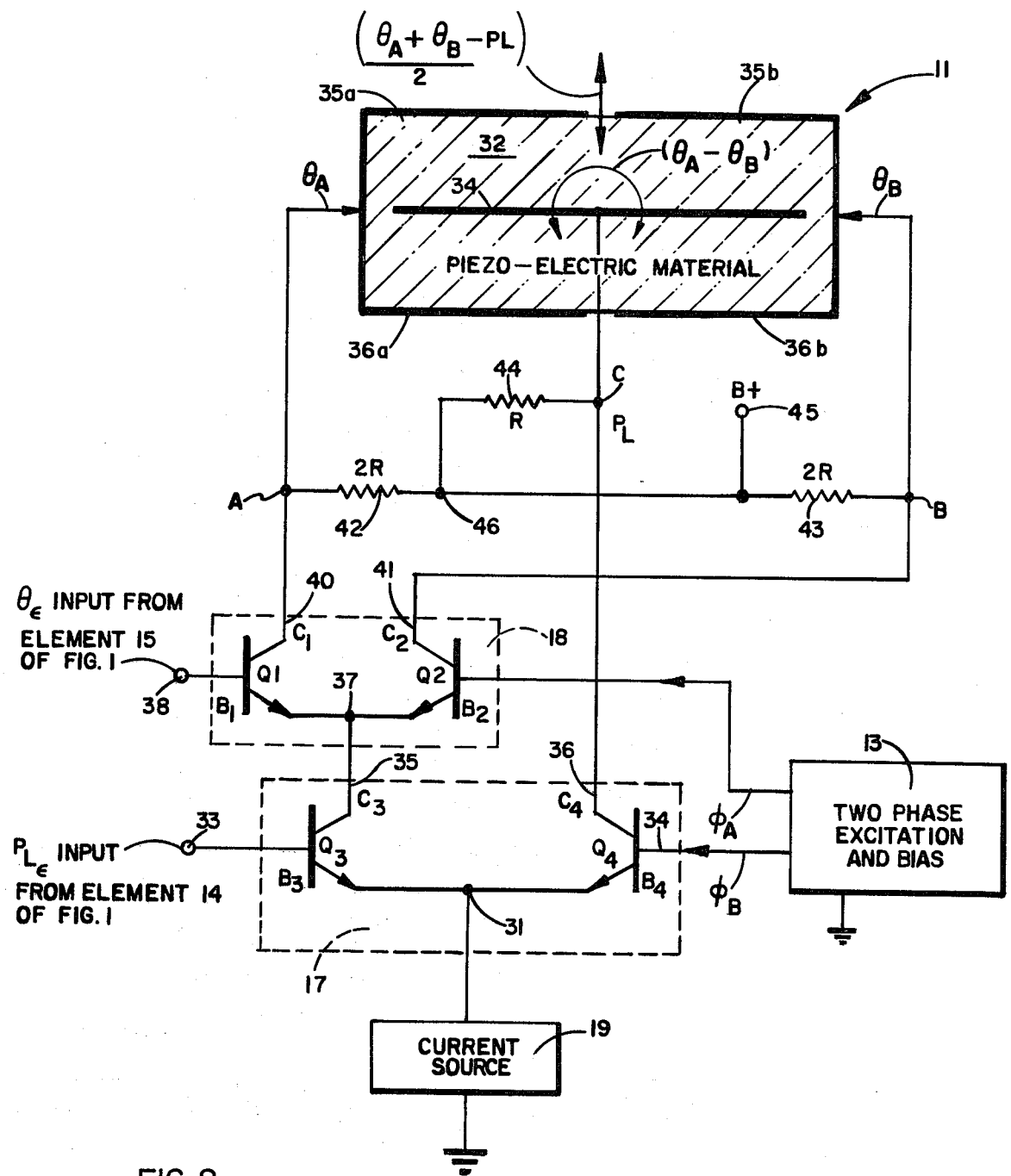
FIG. 2 is a schematic arrangement of the duo-mode bimorph device of FIG. 1 and showing the two-stage differential amplifier therefor in fuller detail.
Figure 3:
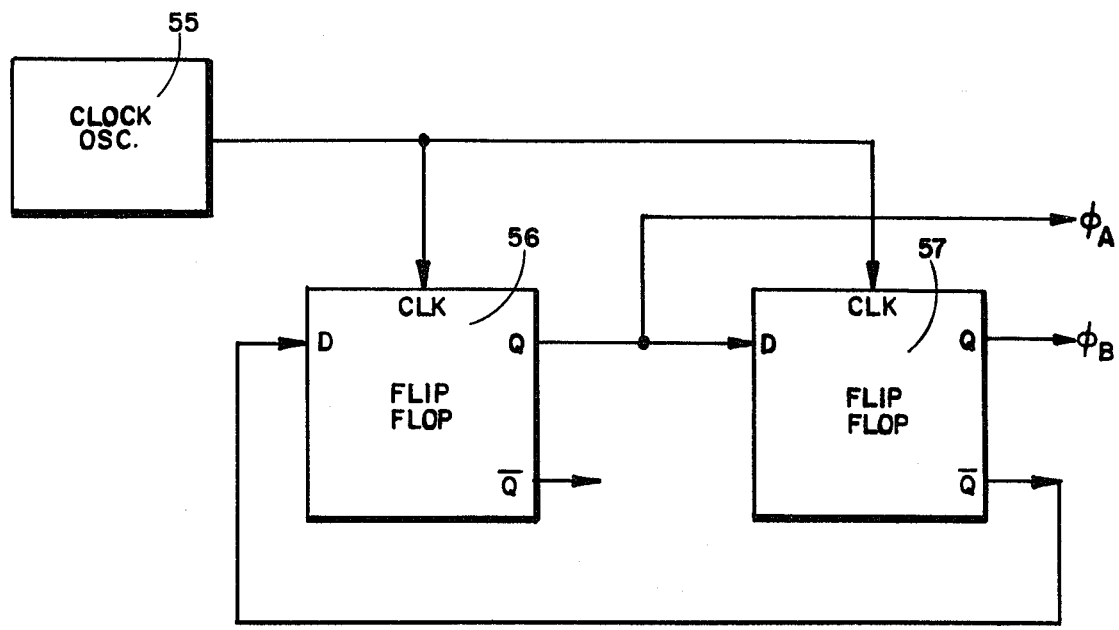
FIG. 3 is a block diagram of an exemplary mechanization of the two-phase source 13 employed in FIG. 1.

As shown more fully in FIG. 2, the bimorph device 10 of FIG. 1 (mounting a mirror 31 located within the laser optics of the laser gyro, as is well understood in the art) is comprised of piezoelectric material 32 sandwiching a center electrically-conductive plate 34 as to comprise a laminate, and two split electrically-conductive outer plates (35a, 35b and 36a, 36b) sandwiching the piezoelectric laminate, the halves of each split outer plate being spaced apart as to be electrically insulated from the other and in registry with a corresponding half of the other split plate and connected in electrical circuit therewith as to comprise a first control mode terminal pair A and B. In other words, half plate 35a is spaced apart from half plate 35b and half plate 36a is spaced apart from half plate 36b, half plates 35a and 36a being in registry and electrically interconnected to define terminal A, and half plates 35b and 36b being in registry and electrically interconnected to define terminal B. Center plate 34 defines a second control mode terminal C.

There is also provided a center-tapped voltage-splitting impedance 42, 43 electrically connected across first control mode terminal pair A and B; a center tap 46 of impedance 42, 43 comprising a B+ power supply terminal, an impedance 44 coupling terminal C to the B+ terminal 46.

The application of a control voltage across terminals A and B of a first terminal pair provides an asymmetrical voltage gradient across the piezoelectric laminate 32, resulting in a torsionally induced angular displacement about the laminate center and transmitted to the mirror (not shown), thereby altering the optical path length of the gyro laser optics.

The application of a control voltage across terminals C and 46 of a second terminal pair provides a symmetrical voltage gradient across laminate 32, resulting in a translational displacement, thereby altering the optical alignment of the gyro laser optics. The combined effect of the concomitant application of exemplary control voltages to both of control terminal pairs A, B and C, 46 is both a translational and angular displacement, as explained more fully in the above-noted co-pending Application Ser. No. 768,511.

Figure 4:
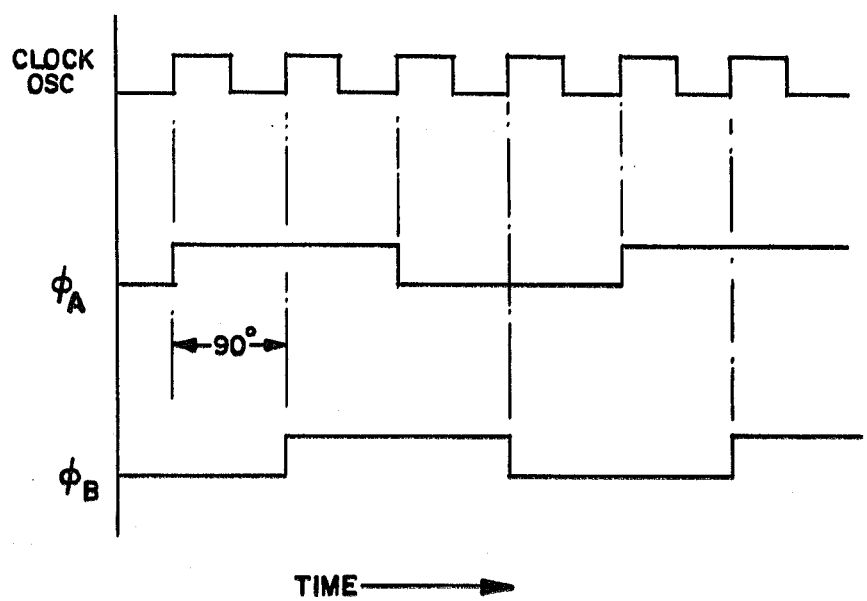
FIG. 4 is a representative time history of the response of various elements in the arrangement of FIG. 3.
Figure 5:
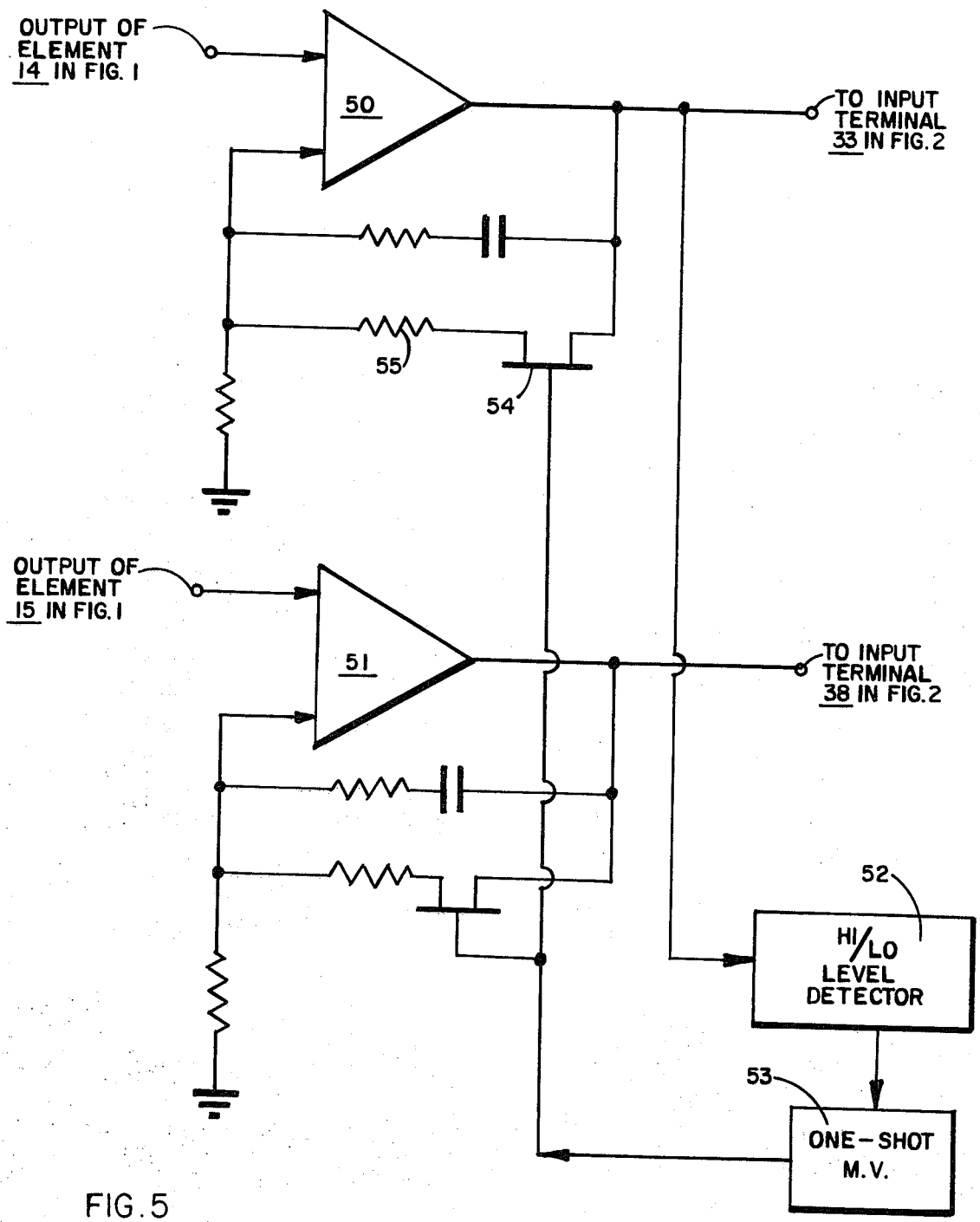
FIG. 5 is a schematic arrangement showing the automatic mode select circuit 14 of FIG. 1 in fuller detail.

Referring again to FIG. 1, there is also provided a source 13 of two phase-coded phase reference signals $\phi_A$ and $\phi_B$. Such signal source may be comprised of a single oscillator the output of which may be separately applied to a first lab circuit and a second lead-lag circuit to obtain two outputs of like frequency and in mutual time-phase quadrature, as is well understood in the art. Further, each of such mutually quadrature time-phase outputs may be separately selectively biased in order to establish a desired bimorph operating point. An exemplary digital mechanization of source 13, by means of a frequency divider comprising clock 55 and cascaded flip-flops 56 and 57, is shown in FIG. 4, while a representative time history of the responses thereof is shown in FIG. 5, illustrating the quadrature time phase relationship between outputs $\phi_A$ and $\phi_B$.

A first and second synchronous detector 14 and 15 are commonly responsively coupled (by amplifier 16) to the output of photodetector 12, each synchronous detector further having a reference input responsive to a mutually exclusive one of phase-coded reference signals $\phi_A$ and $\phi_B$. A dual mode two-stage differential amplifier 20 is responsively coupled to the two outputs of source 13 for applying dither signals to terminals A, B and C of the bimorph device 11 to separately dither each mode of the dual mode bimorph device 12 in response to a mutually exclusive one of the phase-coded reference signals $\phi_A$ and $\phi_B$, amplifier 20 further having a first and second control input 33 and 38 coupled to a respective one of sources 14 and 15 of a (synchronously detected) bipolar control signal for control of a mutually exclusive mode of said duo-mode bimorph device.

In normal operation of the above-described arrangement, the separately applied phase-coded signals $\phi_A$ and $\phi_B$ from element 13 to element 20 serve to separately modulate or dither separate modes of duo-mode bimorph element 11. Such modulations of the laser cavity optics, as detected by element 12, are coupled to both of demodulators 14 and 15 by amplifier 16 (in FIG. 1). Separation of or discrimination between the two detected modulations is effected by phase modulators 14 and 15, demodulator 14 employing the reference signal $\phi_B$ as a phase reference to distinguish or phase-detect the translational-associated modulations at phase $\phi_B$, while demodulator 15 employs the reference signal $\phi_A$ as a phase reference to distinguish or phase-detect the angular displacement-associated modulations at phase $\phi_A$. Low-pass filtering of the demodulator output attenuates signal effects due to heterodyning or mixing of the reference signals.

In other words, (in providing a phase-detected control signal output $P_{L\epsilon}$ to differential amplifier 20) the phase reference input of first phase detector 14 is responsive to that one ($\phi_B$) of the phase-coded reference signals for control of that bimorph mode which is dithered by such phase-coded reference signal $\phi_B$. Similarly, in providing a phase detected control signal output $\theta_\epsilon$ to differential amplifier 20, a reference input of second phase detector 15 is responsive to the other ($\phi_A$) of the phase-coded reference signals for control of that bimorph mode which is dithered by such other phase-coded reference signal $\phi_A$.

Thus, two stage differential amplifier 20 serves as a negative feedback device for closed-loop control of each of the translational (or path length) and angular (or alignment) control modes, as may be more fully appreciated from FIG. 2.

Referring again to FIG. 2, duo-mode differential amplifier 20 is shown in fuller detail as comprising two stages 17 and 18, a first stage 17 having a common terminal 31 coupled to a first or ground terminal of a power supply (not shown) by a high impedance current source 32, a first input terminal 33 adapted to be responsive to an output of a first one 14 of the synchronous detectors of FIG. 1, and a second input terminal 34 of first stage 17 being responsive to one ($\phi_B$) of the phase-coded reference signals provided by element 13, one of two output terminals (35 and 36) of first stage 17 being connected to a said first mode single terminal C of bimorph device 11. A second stage 18 of amplifier 20 has a common terminal 37 coupled to another output terminal 35 of the two output terminals of first stage 17, a first input terminal 38 of second stage 18 being adapted to be responsive to an output of a second one 15 of the synchronous detectors of FIG. 1, a second input terminal being responsive to another ($\phi_A$) of the phase-coded reference signals, each of two output terminals 40 and 41 of second stage 18 being connected to a mutually exclusive one of two terminals A and B of a second mode terminal pair of said bimorph device. A second or B+ terminal 45 of the power supply (not shown) is impedance coupled to each of said three terminals of said bimorph device by a mutually exclusive one of three separate impedance 42, 43 and 44, the two impedances 42 and 43 coupling the second mode terminal pair (A and B) of the bimorph device being substantially equal and the third impedance 44 being substantially one-half of either of impedances 42 and 43. Each stage 17 and 18 of the two-stage differential amplifier 20 comprises a pair of like-poled transistors, each transistor having a base electrode, a first electrode and a second electrode. The first electrode of each transistor pair is connected to form a common terminal, the second electrode of each transistor of the transistor pair comprising a respective first and second output terminal, and the base electrode of each transistor of the transistor pair comprising a respective first and second input terminal.

The two-phase excitation supply 13 (in FIG. 1) generates square wave signals which are phased 90 degrees, one with respect to the other at a frequency which is high with respect to the servo loop bandwidth. Phase $A(\phi_A)$ is applied to transistor $Q_2$ in FIG. 2 which in turn drives transistor $Q_1$ in a differential manner. In the practical case, the load presented to collectors $C_1$ and $C_2$ by the piezo 11 is capacitive, thus, the excitation signals which appear at $\theta_A$ and $\theta_B$ are triangle waves and the phase is plus and minus 90° with respect to $\phi_A$. This signal becomes the excitation for the beam alignment loops.

In a like manner, phase $B(\phi_B)$, which is shifted 90° with respect to $\phi_A$, is applied to transistor $Q_4$, which drives transistor $Q_3$, which in turn drives transistors $Q_1$ and $Q_2$. Transistors $Q_1$ and $Q_2$ divide the current from transistor $Q_3$ such that $\theta_A$ and $\theta_B$ see signals of the same phase relationship. The result of this drive is a triangular voltage which is applied between $P_L$ and the combination $\theta_A$ and $\theta_B$. This signal is shifted 90° with respect to $\phi_B$ and is the excitation for the path length servo loop.

These excitation voltages drive the control piezo 11 to modulate the beam path length and the beam alignment. In effect, this is a disturbance of the path length and alignment which results in a modulation of the beam intensity which is detected by the photodiode intensity pickoff 12 (of FIG. 1). The magnitude of the intensity modulation is proportional to the error of the path length and the misalignment of the beam, while the phase angle is dependent upon the direction of the errors.

The intensity pickoff signals are amplified and demodulated by $\phi_A$ and $\phi_B$, the quadrature excitation signals which separate the path length and alignment error signals, $\theta_\epsilon$ and $P_{L\epsilon}$. These demodulation signals, after filtering to remove the excitation carrier frequency, represent the instantaneous path length and alignment error. Signal $\theta_\epsilon$ is applied to transistor $Q_1$, which drives transistor $Q_2$, and results in a differential d-c drive voltage applied between $\theta_A$ and $\theta_B$ to minimize the alignment error. Likewise, signal $P_{L\epsilon}$ is applied to transistor $Q_3$, thence to transistor $Q_4$ and through transistors $Q_1$ and $Q_2$, resulting in a differential bipolar analog drive voltage between $P_L$ and the combination $\theta_A$ and $\theta_B$, to minimize the path length error.

It is to be appreciated that the disclosed provides several advantages over the mechanization disclosed in the above-noted co-pending Application Serial No. 768,511. In addition to the common use of a single clock oscillator by source 13 for generation of the two reference signals $\phi_A$ and $\phi_B$, it is to be appreciated that the disclosed dual stage differential amplifier arrangement employs only a single or common emitter current source 19 as a further engineering economy. Because a single common current source is employed for both control modes, there is no requirement to match current sources to achieve zero bias drive; only the three resistors 42, 43 and 44 need be matched or ratioed. Moreover, the disclosed circuit arrangement, in driving center electrode plate 34 (of FIG. 2) relative to the outer electrode plates, provides double the drive capability of the conventional circuit arrangement in co-pending Application Ser. No. 768,511 for a given power supply voltage. Such latter advantage arises from the fact that for a given voltage swing $-P_L$ at terminal C (relative to a neutral condition), a corresponding equal and opposite swing $((\theta_A+\theta_B)/2)$ occurs at terminal 46 in FIG. 2.

In the operation of the laser gyro, only one beam alignment results in maximum beam intensity. However, there are many path lengths which result in intensity maxima, the only requirement being that the path length be some discrete multiple of the laser wavelength. In practice, thermal effects cause much greater inherent shifts in path length than in alignment, with the result that under temperature extremes the path length servo becomes saturated in its effort to correct this path length error. An automatic mode select circuit 41 (in FIG. 1) is included in the path length servo to avoid this problem. As the path length servo approaches saturation, the auto mode select detects this condition and momentarily reduces the gain of the servo loop allowing the servo to go open loop. This allows the path length piezo to return to its neutral position. After a prescribed delay, a few milliseconds, the servo loops are again activated and because of the nature of the servo, the path length will pick up a mode requiring only a low control voltage.

An exemplary mechanization of the automatic mode select circuit is shown in fuller detail in FIG. 5.

Referring now to FIG. 5, there is illustrated a schematic arrangement of element 41 of FIG. 1. There is interposed at the respective input of each of terminals 33 and 38 (of FIG. 2) a respective feedback amplifier 50 or 51. Such amplifiers as shown are non-phase-inverting; therefore, negative feedback for gain control purposes is effected by connecting an R-C feedback impedance network between the positive output terminal and the negative input terminal. The output of the path length control amplifier 50 is drivingly coupled to the input of a high/low detector 52 or signal threshold device for detecting the approach of a saturation or predetermined amplitude signal condition. Upon the occurrence of such threshold condition at detector 52, the output thereof excites a one-shot multivibrator 53, causing an output of switching pulse of preselected duration to be applied to a switching control input of a normally open switch 54 or FET (field effect transistor) in the feedback circuit of each of amplifiers 50 and 51, thereby connecting a shunting resistor 55 in the amplifier feedback path. During the pulsewidth of the applied switching pulse output of multivibrator 53, switch 54 is closed, whereby each of shunt resistors 55 serves to reduce the effective gain of feedback amplifiers 50 and 51. Such gain reduction serves to remove the excitation from the piezoelectric material of bimorph device 11 (in FIG. 2), thereby allowing the bimorph device to be restored to a mechanical null. Thus, upon removal or subsidence of the switching voltage and normal opening of switches 54, only a minimum control mode voltage will be required from each of amplifiers 50 and 51 to resume control of its respective control mode.

Thus, it is to be appreciated that there has been described improved dual-mode control means for concomitant control of both the path length and alignment of the laser optics of a laser gyro.

Although the invention has been disclosed and illustrated in detail, it is to be clearly understood that the same is by way of illustration and example only and is not to be taken by way of limitation, the spirit and scope of this invention being limited only by the terms of the appended claims.

I claim:

1. A dual phase-coded control means for control of a three-terminal duo-mode bimorph device having a translational control mode terminal and torsional control mode terminal pair and comprising
    a source of two mutually phase-coded and selectively biased a-c reference signals, and
    a dual mode differential amplifier interconnecting said source to said terminal of said bimorph device for dithering each mode of said dual mode bimorph device in response to a mutually exclusive one of said reference signals, said amplifier further having a first and second control input adapted to be coupled to a respective one of two sources of a bipolar control signal for control of a mutually exclusive mode of said duo-mode bimorph device.

2. The device of claim 1 in which said differential amplifier is comprised of
    two differential amplifier stages, each stage having a first control input terminal and a second dither input terminal, and a differential output terminal pair;
    a second input terminal of each of said two amplifier stages responsive to a mutually exclusive one of said two reference signals of said source,
    a pair of differential output terminals of said second amplifier connected to said torsional control mode terminal pair of said bimorph device, a center-tapped impedance being connected across said terminal pair connection and comprising a terminal of a supply voltage source for said differential amplifier,
    a first terminal of a differential output terminal pair of said first stage being connected to a common terminal of said second stage and a second output terminal of said first stage being connected to said translational control mode terminal of said bimorph device;
    a coupling impedance connected across said translational mode control terminal and a center tap terminal of said centertapped impedance; and
    a high impedance current source interconnecting a common terminal of said first stage and a ground terminal of a supply voltage source for said differential amplifier.

3. The device of claim 2 in which each said differential amplifier comprises a pair of like-poled transistors, each transistor having a base electrode, a collector and an emitter, the emitters of each pair being connected together to form a common terminal, said collectors of each said pair comprising differential output signalling terminals, said bases of each such pair comprising a respective first control and second dither input terminal.

4. In a laser gyro, laser optics adjustment means comprising
    a mirror within the laser optics of said laser gyro mounted upon a three-terminal duo-mode bimorph device for duo-mode modulation of said optics, and
    a two-stage differential amplifier responsively coupled to a source of two mutually phase coded reference signals for separately dithering each mode of the duo-mode bimorph device, each stage being further responsive to a mutually exclusive one of a first and second synchronously detected photodetector laser output of said laser gyro, whereby closed loop control of said laser optics is effected.

5. The device of claim 4 in which said two-stage differential amplifier comprises
    a first stage having a common terminal coupled to a first terminal of a power supply by a high impedance current source, a first input terminal adapted to be responsive to a first one of said synchronously detected photodetected laser outputs, and a second input terminal of said first stage being responsive to a first one of said phase-coded reference signals, one of two output terminals of said first stage being connected to a said first mode single terminal of said bimorph device,
    a said second stage having a common terminal coupled to another output terminal of said two output terminals of said first stage, a first input terminal of said second stage being adapted to be responsive to a second one of said synchronously detected photodected laser outputs and a second input terminal of said second stage being responsive to a second one of said phase-coded reference signals, each of two output terminals of said second stage being connected to a mutually exclusive one of two terminals of a second mode terminal pair of said bimorph device,
    a second terminal of said power supply being impedance coupled to each of said three terminals of said bimorph device by a mutually exclusive one of three separate impedances, the two impedances coupling said second mode terminal pair of said bimorph device being substantially equal.

6. The device of claim 5 in which each stage of said two-stage differential amplifier comprises a pair of like-poled transistors, each transistor having a base electrode, a first electrode and a second electrode, the first electrodes of each transistor pair being connected to form a common terminal, the second electrode of each transistor of said transistor pair comprising a respective first and second output terminal, the base electrode of each transistor of said transistor pair comprising a respective first and second input terminal.

7. The device of claim 4 in which there is further provided
    a first and second phase detector, each commonly responsive to a photodetected output of said laser,
    a reference input of said first detector being responsive to one of said phase coded reference signals for providing a phase detected control signal output to said differential amplifier for control of that bimorph control mode which is dithered by said one of said phase coded reference signals, and
    a reference input of said second phase detector being responsive to the other of said phase coded reference signals for providing a phase detected control signal output to said differential amplifier for control of that bimorph control of that bimorph control mode which is dithered by said other of said phase coded reference signals.

8. In a laser gyro having laser optics adjustment means comprising
    a mirror within the laser optics of said laser gyro mounted upon a three-terminal duo-mode bimorph device for duo-mode modulation of said optics
    a two-stage differential amplifier responsively coupled to a source of two mutually phase coded reference signals for separately dithering each mode of the duo-mode bimorph device,
    and a first and second detector commonly responsive to the photodetected laser output of the laser gyro, each phase detector having a reference input responsive to a mutually exclusive one of said phase coded reference signals for providing a synchronously detected output, said differential amplifier being further responsive to each of said first and second synchronously detected outputs of closed loop control of said laser optics is effected.

9. The device of claim 8 in which said two-stage differential amplifier comprises a first stage having a common terminal coupled to a first terminal of a power supply by a high impedance current source, a first input terminal adapted to be responsive to a first one of said synchronously detected outputs, and a second input terminal of said first stage being responsive to a first one of said phase-coded reference signals, one of two output terminals of said first stage being connected to said first mode single terminal of said bimorph device, a said second stage having a common terminal coupled to another output terminal of said two output terminals of said first stage, a first input terminal of said second stage being adapted to be responsive to a second one of said synchronously detected outputs and a second input terminal of said second stage being responsive to a second one of said phase-coded reference signals, each of two output terminals of said second stage being connected to a mutually exclusive one of two terminals of a second mode terminal pair of said bimorph device, a second terminal of said power supply being impedance coupled to each of said three terminals of said bimorph device by a mutually exclusive one of three separate impedances, the two impedances coupling said second mode terminal pair of said bimorph device being substantially equal.

10. The device of claim 8 in which the two stage differential amplifier comprises a first pair of like-poled transistors, each transistor having a first, second and base electrode, the first electrodes of said first pair being common terminal coupled to a first terminal of a power supply, the base terminal of a first transistor forming a first input terminal adapted to be responsive to a first one of said synchronously detected outputs, the base terminal of a second transistor forming a second input terminal responsive to a first one of said phase-coded signls, the second electrode of said second electrode being connected to said first mode single terminal of said bimorph device;

a second pair of like-poled transistors, each transistor having a first, second and base electrode, the base terminal a first transistor of said second pair being adapted to be responsive to a second one of said synchronously detected outputs, the first electrodes of said second pair being commonly connected to form a second common terminal, the base terminal of a second transistor of said second pair being responsive to a second one of said phase coded reference signals, each of the second electrodes of said second pair being connected to a mutually exclusive one of two terminals of a second terminal pair of said bimorph device;

a second terminal of said power supply being impedance coupled to each of said three terminals of said bimorph device by a mutually exclusive one of three separate impedances, the two impedances coupling said second mode terminal pair of said bimorph device being substantially equal.

* * * * *